United States Patent
Kobayashi

(10) Patent No.: US 6,346,448 B1
(45) Date of Patent: Feb. 12, 2002

(54) METHOD OF MANUFACTURING A SEMICONDUCTOR DEVICE

(75) Inventor: Migaku Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/645,074

(22) Filed: Aug. 23, 2000

(30) Foreign Application Priority Data

Aug. 24, 1999 (JP) .......................................... 11-236948

(51) Int. Cl.$^7$ ............................................ H01L 21/336
(52) U.S. Cl. .......................... 438/303; 438/4; 438/305; 438/306
(58) Field of Search ........................... 438/4, 301, 303, 438/305, 306, 307, 308

(56) References Cited

U.S. PATENT DOCUMENTS

| | | | | |
|---|---|---|---|---|
| 5,793,089 A | * | 8/1998 | Fulford, Jr. et al. | 257/408 |
| 5,895,955 A | * | 4/1999 | Gardner et al. | 257/336 |
| 6,057,243 A | * | 5/2000 | Nagayama | 438/700 |
| 6,232,224 B1 | * | 5/2001 | Inoue | 438/639 |

FOREIGN PATENT DOCUMENTS

| | | |
|---|---|---|
| JP | 7-202179 | 8/1995 |
| JP | 10-200067 | 7/1998 |

* cited by examiner

Primary Examiner—Trung Dang
(74) Attorney, Agent, or Firm—Darryl G. Walker

(57) ABSTRACT

A method of manufacturing a semiconductor device having transistors with lightly doped diffusion regions (LDD) and self-aligned contacts to a reduced inter-gate spaces is disclosed. According to one embodiment, a method may include forming a gate and top insulating layer (004 and 005) on a semiconductor substrate (001). LDD regions (007) may be formed in a first area (Rpc) and source/drain regions (011) may be formed in a second area (Rmc). An etch stop layer (012), which may comprise silicon nitride, can then be formed. Sidewalls (006), which may comprise silicon dioxide, may be formed on gate layer (004) in a first area (Rpc), while inter-gate spaces in the second area (Rmc) may be filled with a sidewall layer. Source/drain regions (008) may then be formed in a first area (Rpc). A heat treatment can be applied that can restore etch resistance properties of the etch stop layer (012) which can be degraded when source/drain regions (008) are formed. Sidewalls (006) in a first area (Rpc) and sidewall layer material in inter-gate spaces in a second area (Rmc) may then be removed by a wet etch, for example.

20 Claims, 5 Drawing Sheets

METHOD OF MANUFACTURING A SEMICONDUCTOR DEVICE

TECHNICAL FIELD

The present invention relates generally to the manufacture of semiconductor devices, and more particularly to manufacturing semiconductor devices that include lightly-doped diffusion (LDD) regions and self-aligned contact structures on the same substrate.

BACKGROUND OF THE INVENTION

A continuing goal in the manufacture of semiconductor devices is increased density and miniaturization. Such goals can be particularly important in memory devices, such as dynamic random access memories (DRAMs), which may include millions of repeated memory cells. One way to increase device density can be to reduce the space between adjacent structures. For example, in semiconductor devices that include circuit devices, such as insulated gate field effect transistors (IGFETs), it can be desirable to reduce inter-gate spacing.

Reduced inter-gate spacing can present difficulties in forming contacts (including vias). Semiconductor devices can typically include one or more layers that may be connected to one another with contacts. To reduce spacing, and thereby increase density, it can be desirable to place such contacts as close as possible to adjacent structures, such as transistor gates. A preferred method of forming closely spaced contacts is to form self-aligned contacts. Self-aligned contact methods are disclosed in Japanese Patent Application Laid-Open No. Hei 9-134956 and Japanese Patent Application Laid-Open No. Hei 10-144633.

Referring now to FIG. 2A, a conventional approach to forming self-aligned contacts may include forming isolation regions 102 and a gate insulator 103 on a semiconductor substrate 101. Isolation regions 102 and/or a gate insulator 103 may comprise silicon dioxide. A transistor gate layer 104 may then be formed over the semiconductor substrate 101. A gate layer 104 may comprise polycrystalline and/or amorphous silicon (referred to herein collectively as polysilicon) doped with an impurity. A top insulating layer 105 may then be formed over a transistor gate layer 104.

A gate pattern (not shown) may then be formed over a top insulating layer 105 that contains a desired gate shape. A gate pattern may comprise a resist, such as photoresist, formed with a patterning process such as a lithography process or the like. Anisotropic etching can then transfer the gate pattern to form a top insulating layer 105, gate layer 104 and/or gate insulator 103 with a predetermined shape, as shown in FIG. 2A.

A sidewall insulating film can then be formed over patterned gate structures. A sidewall insulating film may comprise silicon dioxide deposited with chemical vapor deposition (CVD) techniques, for example. An etch back step may then remove the sidewall insulating film to form sidewalls 106. A top insulating layer 105 and sidewalls 106 can serve to protect a gate layer 104 from subsequent etching steps. In particular, such structures can prevent a gate layer 104 from being exposed when a contact hole is formed in close proximity to a gate layer 104.

A first and second etch stop layer, 108 and 107, may then be formed over a substrate. A first etch stop layer 108 may comprise silicon nitride. A second etch stop layer 107 may comprise silicon dioxide. An etch stop layer may prevent a semiconductor substrate 101 from being exposed when a contact hole is formed.

Following the formation of etch stop layers (108 and 107), an interlayer insulating film 109 may be formed. An interlayer insulating film 109 may comprise silicon dioxide. A contact hole etch mask 110 may then be formed over the interlayer insulating film 109. A contact hole etch mask 110 may include openings at the desired location of a contact hole. A conventional semiconductor device following the formation of a contact hole etch mask is shown in FIG. 2A. A contact hole etch mask 110 may comprise a layer of patterned resist, or the like.

Referring now to FIG. 2B, a conventional method may continue with a first contact hole etch. A first contact hole etch may be an anisotropic etch that is selective to a first etch stop layer 108. Thus, following a first contact hole etch, a contact hole may be formed through an interlayer insulating film 109 to expose etch stop layer 108. A conventional semiconductor device following a first contact hole etch is shown in FIG. 2B.

A second contact hole etch may then occur that is also anisotropic and selective to second etch stop layer 107. Such an etching can remove a first etch stop layer 108 at the bottom of a contact hole and expose a second etch stop layer 107. A third contact hole etching may then remove the second etch stop layer 107 at the bottom of a contact hole, thereby exposing a semiconductor substrate 101 at the bottom of a contact hole 113. A conventional semiconductor device following all contact hole etching steps is shown in FIG. 2C.

Referring once again to FIG. 2C, once a contact hole 113 is formed, the contact hole 113 may be filled with a conducting material. In this way a self-aligned contact may be formed. The contact may be self-aligned, as there is no minimum spacing requirement between a gate layer 104 and a contact due to the protection provided by a sidewall 106 and/or top insulating layer 105.

In addition to reductions in inter-gate spacing, miniaturization has also resulted in smaller gate lengths for IGFETs. Unfortunately, smaller gate lengths can lead to short channel effects and hot carrier effects, which can adversely affect transistor performance and/or reliability. One way to address such adverse effects can be to form transistors with lightly doped diffusion (LDD) regions (also referred to as lightly doped drains).

A conventional approach to forming LDD regions is disclosed in Japanese Patent Application Laid Open No. Hei 7-202179. The LDD structure is formed in the manufacture of a metal-oxide-semiconductor (MOS) type IGFET.

Referring now to FIG. 3A, a conventional method of forming MOS transistors with LDD regions can include forming isolation regions 202 and a gate insulator 203 on a semiconductor substrate 201. A transistor gate layer 204 may then be formed over the semiconductor substrate 201. A top insulating layer 205 may then be formed over a transistor gate layer 204. A gate etch mask (not shown) may then be formed over a top insulating layer 205. A gate etch mask may include a desired gate shape.

Anisotropic etching can transfer a gate pattern from a gate etch mask to the top insulating layer 205, gate layer 204 and/or gate insulator 203 to form a predetermined shape, as shown in FIG. 3A.

Isolation regions 202 and/or a gate insulator 203 may comprise silicon dioxide. A gate layer 204 may comprise polysilicon doped with an impurity. A top insulating layer 205 may comprise silicon dioxide. A gate etch mask may comprise a resist, such as photoresist, formed with a patterning process such as a lithography process, or the like.

Referring now to FIG. 3B, a LDD ion implantation step may then be performed. A LDD ion implantation may be a blanket implant at an injection dosage and energy that are relatively small with respect to a subsequent source/drain implant discussed below. In an LDD ion implantation step, a structure formed by top insulating layer 205, gate layer 204 and gate insulator 203 may serve as an implantation mask. LDD regions are shown as items 207 in FIG. 3B.

Following a LDD implant step, a sidewall insulating film can then be formed over a semiconductor substrate 201. A sidewall insulating film may then be etched back to form sidewalls 206. A sidewall insulating film may comprise CVD silicon dioxide. A conventional semiconductor device following the formation of sidewalls 206 is shown as item FIG. 3C.

Referring now to FIG. 3D, following the formation of sidewalls 206, a source/drain ion implantation step may be performed. A source/drain ion implantation may be a blanket implant at an injection dosage and energy that are relatively large with respect to the LDD implant step discussed above. In a source/drain ion implantation step, a structure formed by sidewalls 206, top insulating layer 205, gate layer 204 and gate insulator 203 may serve as an implantation mask. Source/drain regions are shown as items 208 in FIG. 3D. It is noted that an implantation mask for a source/drain implant can cover at least a portion of an LDD region. Consequently, as shown in FIG. 3D, LDD regions 207 can remain between source/drain regions 208 and a channel region formed below a transistor gate.

While self-aligned contacts and transistors with LDD regions can result in greater miniaturization and density in a semiconductor device, the inclusion of such features can raise problems in a manufacturing process.

One problem may occur in devices that have a high density region (such as a memory cell array) and another region with LDD regions (such as a periphery region). In particular, because a high density region may have very small inter-gate spacing, a sidewall etch back step may not sufficiently remove a sidewall insulating layer from between gates in a memory cell array. For example, a high density region on a semiconductor device may have inter-gate spacing of 0.2 microns (um) or less. At the same time, a sidewall for an LDD region may be about 0.1 um. Thus, when 0.1 um sidewalls are formed in an inter-gate spacing of 0.2 um or less, a sidewall etch back step may not be capable of clearing inter-gate spaces in the high density region. It is noted that such a problem may be increasingly difficult to address as miniaturization and density continue to increase.

Referring now to FIGS. 4A to 4D, a conventional manufacturing process for a semiconductor device having a high density region and LDD regions is shown in a series of cross sectional views. FIGS. 4A to 4D show a semiconductor device having a DRAM memory cell region Rmc, which can be a high density region, and a peripheral circuit region Rpc, which can be a LDD region.

Referring now to FIG. 4A, a method may include forming isolation regions 302 and a gate insulator (not shown) on a semiconductor substrate 301. A transistor gate layer 304 may then be formed over the semiconductor substrate 301. A top insulating layer 305 may then be formed over a transistor gate layer 304. A gate etch mask (not shown) may then be formed over a top insulating layer 305. Isolation regions 302 and/or a gate insulator may comprise silicon dioxide. A gate layer 304 may comprise polysilicon doped with an impurity. A top insulating layer 305 may comprise silicon dioxide.

A gate etch mask (not shown) may then be formed over a top insulating layer 305 that includes a desired gate pattern. Anisotropic etching can transfer a gate pattern from a gate etch mask to the top insulating layer 305, gate layer 304 and/or gate insulator, to form gate structures. Gate structures are shown in FIG. 4A.

Referring now to FIG. 4B, a LDD and array source/drain ion implants may then be performed. A LDD ion implantation may be an implant for peripheral regions having an injection dosage and energy that are relatively small with respect to a subsequent peripheral source/drain implant that follows. A LDD) ion implantation may form LDD regions 307 in peripheral circuit region Rpc. An array source/drain implant can form array source/drain regions 311 in memory cell region Rmc.

Referring now to FIG. 4C, a sidewall insulating film may then be formed over a semiconductor substrate 301. A sidewall insulating film may then be etched back to from sidewalls 306 in the peripheral circuit region Rpc and the memory cell region Rmc. A sidewall insulating film may comprise CVD silicon dioxide.

Referring now to FIG. 4D, following the formation of sidewalls 306, a peripheral source/drain ion implantation may be performed. A peripheral source/drain ion implantation step may be an implant on the peripheral circuit region Rpc at an injection dosage and energy that are relatively large with respect to the LDD implant step discussed above.

It is noted that FIG. 4D shows an case where inter-gate spacings in a memory cell region Rmc are sufficiently large enough to enable a sidewall etch back to expose a semiconductor substrate 301. An example of a case where inter-gate spacing in a memory cell region Rmc is smaller than that of FIG. 4D will now be described with reference to FIG. 5A.

As shown in FIG. 5A, in a memory cell region Rmc having smaller inter-gate spacing, inter-gate regions may not be sufficiently cleared of a sidewall insulating layer.

Referring now to FIG. 5B, a base insulating layer 312 may be formed over a semiconductor substrate 301. A base insulating layer 312 may provide insulation between various layers and may also serve as an etch stop.

An interlayer insulating film 309 can then be formed over base insulating layer 312. A contact hole etch mask (not shown) may then be formed over the interlayer insulating film 309. A contact hole etch mask may comprise resist and include openings at the desired location of a contact hole. Anisotropic etching may then form contact holes through interlayer insulating film 309 to base insulating layer 312, which may serve as an etch mask. In addition, additional etching within memory cell region Rmc can form a contact hole through base insulating layer 312, as shown in FIG. 5C.

Ideally, additional etching in memory cell region Rmc should expose a semiconductor substrate. However, as noted above, as inter-gate spacing decreases, sidewalls on opposing sides of a contact area can encroach on one another. Consequently, etching within a memory cell region Rmc may not clear a contact hole. Thus, as shown in FIG. 5D, in a peripheral circuit region Rpc, a contact hole 313 may extend to a base insulating layer 312. However, in a memory cell region Rmc, portions of a sidewall insulating film may undesirably remain at the bottom of contact holes 314.

Referring now to FIG. 5D, additional etching in a memory cell region may be performed to clear inter-gate spaces. However, such etching may undesirably expose a gate layer 304. Consequently, if a contact hole 314 is filled with a conducting material, a short circuit may be formed between such a conducting material and the exposed areas of a gate layer 304.

One approach to addressing the above-described drawback is shown in Japanese Patent Application Laid-Open No. Hei 8-139314. It is noted, however, that the method of Japanese Patent Application Laid-Open No. Hei 8-139314 forms a direct contact to a semiconductor substrate without forming an interlayer insulating film. Such a method will now be described with reference to FIGS. 6A to 6C.

A second conventional method may form structures such as those shown in FIG. 6A. Such structures may be formed with a similar method as described in conjunction with FIGS. 4A and 4B. Such structures may include a semiconductor substrate 301, isolation regions 302, a gate insulator (not shown), a transistor gate layer 304, a top insulating layer 305, LDD regions 307, and array source/drain regions 311. LDD regions 307 may be formed in a peripheral circuit region Rpc. Array source/drain regions 311 may be formed in a memory cell region Rmc.

Referring now to FIG. 6B, a base insulating layer 312 may then be formed over a semiconductor substrate 301. A base insulating layer 312 may comprise CVD silicon dioxide, for example. Unlike previously described conventional approaches, a polysilicon layer may then be formed over the surface of the device. Such a polysilicon layer may then be etched back, by an anisotropic etch for example, to form polysilicon sidewalls 306 in peripheral circuit region Rpc. Within memory cell region Rmc, inter-gate spaces may be filled with polysilicon.

Following the formation of polysilicon sidewalls 306, a peripheral source/drain ion implantation may be performed. A peripheral source/drain ion implantation step may be an implant in the peripheral circuit region Rpc at an injection dosage and energy that are relatively large with respect to a previous LDD implant step.

Referring now to FIG. 6C, an etch mask 310 may then be formed over a semiconductor substrate 301. An etch mask layer 310 may comprise a resist material, and include openings at the desired location of contact holes. Portions of a base insulating layer 312 at the bottom of such etch mask openings may then be removed to form contact holes 313 in the peripheral circuit region Rpc and the memory cell region Rmc. It is noted that within a memory cell region Rmc, such an etching step may include removing polysilicon exposed at the bottom of an etch mask opening. Such a step may include a etch having a high degree of selectivity between a polysilicon and the base insulating layer 312, which may comprise silicon dioxide.

As shown in FIG. 6C, because base insulating layer 312 is relatively thin with respect to top insulating layer 305, a semiconductor substrate can be exposed without exposing a gate layer 304. That is, a top insulating layer 305 may insulate the top of a gate layer 304 while remaining portions of a base insulating layer 312 may insulate the sides of a gate layer 304.

An etch mask 310 may then be removed, and a conductive wiring can be formed to active regions of a semiconductor substrate 301 through contact holes 313.

However, as noted above, the method of FIGS. 6A to 6C forms "direct" contacts to a substrate and does not form an interlayer insulating film. If such a method was used in conjunction with an interlayer insulating film, it is believed that drawbacks could occur.

One drawback can be the overetching of the base insulating layer 312 and resulting exposure of a gate layer 304. With a gate layer 304 exposed, a short circuit may be result when a conductive material fills a contact hole. More particularly, an interlayer insulating film may comprise silicon dioxide, including undoped silicon dioxide (also referred to as nondoped silicate glass, or NSG) and borophosphosilicate glass (BPSG). At the same time, a base insulating layer 312 may also comprise silicon dioxide, as noted above. Consequently a contact hole etch could have no significant selectivity between a base insulating layer 312 and an interlayer insulating film, making it difficult to etch a contact hole without overetching the thin base insulating layer 312.

Another drawback can be the quality of a contact formed in a peripheral circuit region Rpc. As noted above, a contact hole etch could have no significant selectivity between a base insulating layer 312 and an interlayer insulating film. As a result, a base insulating layer 312 may not serve as an etch stop, and a contact hole can be overetched and/or underetched.

Another approach to forming contacts and LDD regions is shown in Japanese Patent Application Laid-Open No. Hei 10-200067, which shows a method of manufacturing a contact over bit line (COB) type DRAM. The method shows an approach in which sidewalls are formed to allow LDD regions to be created, and then removed to form contacts. However, the method does not show self-aligned contacts. The method will now be described with reference to FIGS. 7A to 8B.

Referring now to FIG. 7A, a p-type semiconductor substrate (PSUB) may include an n-well formed therein (NWELL). A p-well (PWELL) may be formed in the n-well. Isolation regions 420 and a gate insulating film (not shown) can be formed on the substrate. A gate layer may be formed that includes a layer of polysilicon 431a and tungsten silicide 431b. A gate etch mask (not shown) may be formed over a gate layer that includes a desired gate shape, and may be formed from a resist. An etching step may then be performed that forms gate electrodes 431. An ion implantation step may then form LDD regions 411.

Next, as shown in FIG. 7B, an etch stop film 421 of silicon dioxide may be formed over a substrate. A layer of polysilicon may then be formed over the etch stop film 421 and then etched back, with an anisotropic etch for example, to form polysilicon sidewalls 441. An ion implantation step may then form source/drain regions 412.

Next, as shown in FIG. 7C, polysilicon sidewalls 441 may be removed and a silicon nitride film 422 formed over etch stop film 421. A silicon nitride film 422 may be deposited with a reduced pressure CVD process to a thickness of several tens of nanometers. A process may also include forming a first interlayer insulating film 423 and a second interlayer insulating film 424. A first interlayer insulating film 423 may comprise NSG. A second interlayer insulating film 424 may comprise BPSG.

Next, as shown in FIG. 8D, a second interlayer insulating film 424 may be reflowed and leveled. A polysilicon film 442 may then be deposited, by a CVD method for example. An etch mask R1 may then be formed on polysilicon film 442. An etch mask R1 may be a patterned layer of resist, or the like.

Next, anisotropic etching can occur with etch mask R1 in place. Such anisotropic etching may stop above a gate electrode. A silicon nitride film 422 may protect a gate electrode 431 from being exposed by such an etch.

Referring now to FIG. 8E, another polysilicon film may then be deposited, by a CVD method or the like. Such a polysilicon film may then be etched, by anisotropic etching, to form polysilicon sidewalls 442a. Portions of a first insulating layer 423, silicon nitride film 422 and etch stop layer 421 may then be anisotropically etched to expose a substrate and form contact holes NCH and BCH.

Contact holes NCH and BCH may then be filled with polysilicon doped with an impurity to thereby form contacts.

In the previously described two methods, a base insulating film 312 and etch stop layer 421 may be formed from silicon dioxide. Thus, the material from which sidewalls are formed (sidewalls used to establish LDD regions) can be selected to have a high degree of etch selectivity with respect to silicon dioxide. Thus, such a sidewall material can be polysilicon.

In light of the above discussion, it would be desirable to arrive at some way of forming a semiconductor device that includes self-aligned contacts and LDD regions for devices having reduced spacings between structures, such as inter-gate spacings of 0.2 um and smaller.

SUMMARY OF THE INVENTION

According to the present invention, a method of manufacturing a semiconductor device can include implanting ions into an etch stop layer formed over a semiconductor substrate. An etch stop layer may then be heat treated to improve etch resistance which may have been affected by such an implanting of ions.

According to one aspect of the embodiments, a method may include forming a semiconductor device having a first area that includes lightly doped diffusion regions and a second area that includes self-aligned contacts formed with respect to reduced inter-gate spacing.

According to one aspect of the embodiments, a method may include forming a gate structure that includes a gate layer and top insulating layer, forming LDD regions in a first area and source/drain regions in a second area, and forming an etch stop layer over the first and second areas. A sidewall layer can then be formed over the etch stop layer, and then etched with a high selectivity with respect to the etch stop layer to form sidewalls in the first area while inter-gate spaces in a second area can remain filled with the sidewall layer. Source/drain regions may then be formed in the first area. A heat treatment can then take place. Sidewalls and portion of the sidewall layer in inter-gate spaces may then be removed. An interlayer insulating film can then be formed over the first and second areas. Contact holes may then be etched through the interlayer insulating film to expose portions of the semiconductor substrate. Contact holes may then be filled to form self-aligned contacts in at least the second area.

DETAILED DESCRIPTION OF THE EMBODIMENTS

Various embodiments of the present invention will now be described to in detail with reference to a number of drawings.

Referring now to FIGS. 1A to 1F, a method of forming a semiconductor device that includes self-aligned contacts and lightly doped diffusion (LDD) regions will now be described in a series of side cross sectional views. The various views of FIGS. 1A to 1F include a high density region, which may be a memory cell region Rmc, and a LDD region, which may be a peripheral circuit region Rpc.

Figure 1A:
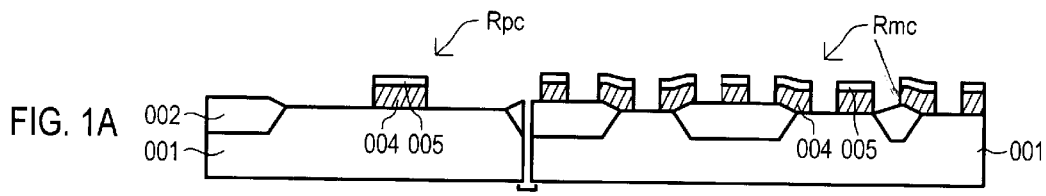
FIGS. 1A to 1F are side cross sectional views of one embodiment of the present invention.

Referring now to FIG. 1A, a method according to the present invention may include forming isolation regions 002 and a gate insulator (not shown) on a semiconductor substrate 001. Isolation regions 002 and a gate insulator may comprise silicon dioxide, for example.

A gate layer 004 may then be formed over the semiconductor substrate 001. A gate layer 004 may comprise polycrystalline and/or amorphous silicon (collectively referred to as polysilicon) doped with an impurity. In addition, a top insulating layer 005 may be formed over the transistor gate layer 004. A top insulating layer 005 may comprise silicon dioxide and/or silicon nitride.

A gate pattern (not shown) may then be formed. A gate pattern may include a gate wiring pattern for a semiconductor device. A gate pattern may comprise a resist, such as photoresist, formed with a patterning process such as lithography, or the like. With a gate pattern serving as an etch mask, anisotropic etching can etch through exposed portions of a top insulating layer 005, gate layer 004 and/or gate insulator to form gate structures of predetermined shapes, such as those shown in FIG. 1A.

Figure 1B:
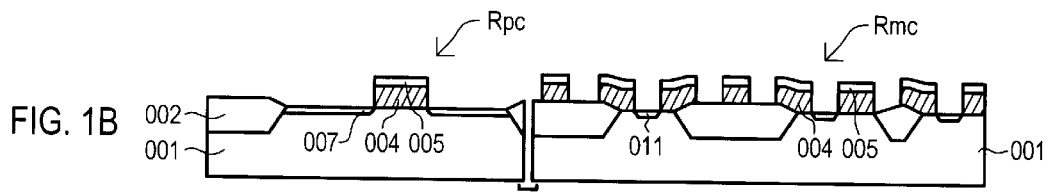

Referring now to FIG. 1B, one or more ion implantation steps may be performed. An ion implantation step may be performed in a peripheral circuit region Rpc to from LDD regions 007. Such an ion implantation step may be performed at a dose and energy that is lower than a subsequent step that forms source/drain regions in the peripheral circuit region Rpc. In addition, one or more ion implantation steps may be performed in a memory cell region Rmc to form memory cell source/drain regions 011.

In one particular arrangement, implantation masks may be formed to alternately mask a peripheral circuit region Rpc and a memory cell region Rmc. As but one example, a memory cell region may be masked, with a resist or the like, while a peripheral circuit region Rpc is exposed and LDD regions 007 are formed therein. A peripheral circuit region Rpc may then be masked, with a resist or the like, while a memory cell region Rmc is exposed and memory cell source/drain regions 011 are formed therein.

In a semiconductor memory device that includes complementary devices (e.g., n-channel transistors and p-channel transistors) the various implant steps may use particular dopant element sources to form n-channel and p-channel LDD and/or memory cell source/drain regions. As but a few examples, n-channel regions may be formed by implanting arsenic and/or phosphorous. P-channel regions may be formed by implanting with difluoroborane ($BF_2$).

In one very particular approach, in a peripheral circuit region Rpc, LDD regions 007 may be formed with at a dosage in the general range of $1\times10^{12}$ to $1\times10^{14}$ atoms/cm$^2$, and an implant energy in the general range of about 10 to 100 KeV. In a memory cell region Rmc, memory cell source/drain regions 011 may be formed with at a dosage in the general range of $1\times10^{15}$ to $1\times10^{16}$ atoms/cm$^2$, and an implant energy in the general range of about 10 to 180 keV.

Figure 1C:
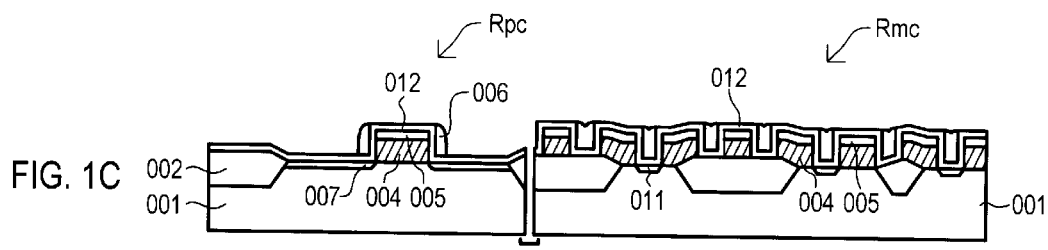

Referring now to FIG. 1C, an etch stop layer 012 may be formed over a surface of a semiconductor device that includes the peripheral circuit region Rpc and memory cell region Rmc. An etch stop layer 012 may have one or more of the following functions: Serve as an etch stop in the formation of a sidewalls used to form LDD regions; serve as an etch stop when such sidewalls are removed; and/or serve as a contact hole etch stop in a peripheral circuit region Rpc.

An etch stop layer 012 may preferably comprise silicon nitride. An etch stop layer 012 may have a lower range thickness of no less than about 10 nm, more preferably in the general range of 20 nm. An etch stop layer 012 may have a higher range thickness no greater than about 100 nm, more preferably no greater than about 50 nm.

It is noted that a thickness of an etch stop layer 012 can affect the size of a subsequently formed LDD regions, as such an etch stop layer 012 can mask source/drain implant regions (i.e., an etch stop layer 012 and subsequently formed sidewall can determined LDD region size between a channel and a source/drain region). Accordingly, a thickness in the above described range is preferable.

An etch stop layer 012 may be CVD silicon nitride. More particularly, an etch stop layer 012 may be low pressure (LPCVD) silicon nitride which may provide better step coverage than higher pressure CVD approaches.

It is also noted that an etch stop layer 012 of silicon nitride may be formed over a previously formed layer of silicon dioxide (not shown). Such a silicon dioxide film may be CVD silicon dioxide as but one example. Such an initial silicon dioxide film can improve contact hole formation and/or relieve stress between a silicon nitride etch stop layer 012 and a semiconductor substrate 001.

Following the formation of etch stop layer 012, a sidewall layer may be formed over a surface of a semiconductor device that includes the peripheral circuit region Rpc and memory cell region Rmc. Such a sidewall layer may be etched back, by anisotropically etching for example, to form sidewalls 006. A sidewall layer material may be selected to provide a high degree of etch selectivity between an etch stop layer 012 and the sidewall layer. Such an etch selectivity may allow sidewalls 006 to be formed by anisotropically etching while maintaining an etch stop layer 012 essentially intact. Such an etch selectivity can also allow such sidewalls 006 to be removed by isotropically etching while maintaining an etch stop layer 012 essentially intact.

According to one approach, a sidewall layer may comprise silicon dioxide more preferably CVD silicon dioxide. CVD silicon dioxide layer thickness can typically be highly controlled. Silicon dioxide sidewalls 006 may also be readily removed with a wet etch, such as one containing hydrofluoric acid, for example. However, such a particular material should not be construed as necessarily limiting the invention thereto. Alternate sidewall layer materials may comprise polysilicon and/or phosphosilicate glass (PSG), to name but two possible examples.

As noted above, the thickness of a sidewall 006 and etch stop layer 012 can affect the extents of a LDD region 007. Thus, the thickness of both a sidewall 006 and etch stop layer 012 are taken into account when determining an LDD region 007 size. In one particular example, a sidewall layer may be no less than about 50 nm and no greater than about 200 nm.

It is noted that while sidewall layer formation and etch back steps may form sidewalls 006 in a peripheral circuit region Rpc, due to relatively narrow inter-gate spacing, inter-gate areas within a memory cell region Rmc can remain filled with a sidewall layer. For example, if an inter-gate spacing is 200 nm or less and a sidewall layer thickness of 100 nm or more, a sidewall layer etch back step may not significantly remove a sidewall layer from inter-gate spaces in memory cell region Rmc.

While a sidewall etch back step may not clear inter-gate spaces of a sidewall layer, as will be shown below, a memory cell region Rmc may still include self-aligned contacts. Thus, the present invention may be capable of providing self-aligned contacts for contact hole spacings that are equal to or less than two times the thickness of a LDD sidewall 006.

Figure 1D:
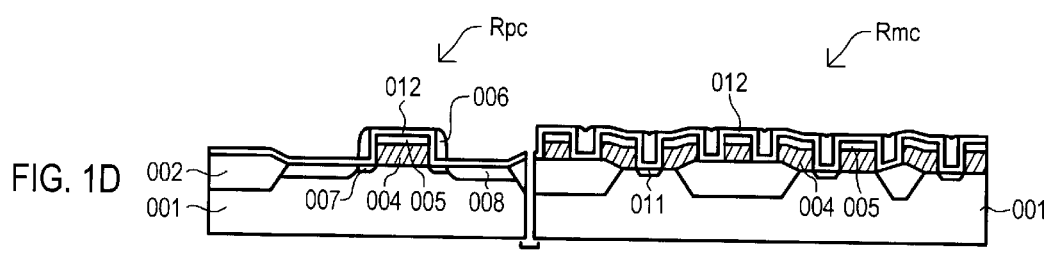

Referring now to FIG. 1D, an ion implantation step may form peripheral source/drain regions 008. Such an ion implantation step may be at a higher concentration and/or higher dose than the ion implantation step that the forms LDD regions 007. Further, a structure that includes a gate layer 004, top insulator 005, etch stop layer 012 and sidewall 006 can serve as an ion implantation mask resulting in LDD regions 007 between a transistor channel regions and deeper and/or more highly concentrated source/drain regions 008.

As in the case of the ion implantation steps used to form LDD regions 007 and memory cell source/drain regions 011, in the event a peripheral circuit region Rpc includes complementary devices, a peripheral source/drain implant step may use particular dopant element sources to form n-channel and p-channel regions. As but a few examples, n-channel peripheral source/drain regions may be formed by implanting arsenic and/or phosphorous. P-channel peripheral source/drain regions may be formed by implanting with difluoroborane (BF$_2$).

In one very particular approach, in a peripheral circuit region Rpc, peripheral source/drain regions 008 may be formed with a dosage in the general range of about $1\times10^{15}$ to $1\times10^{16}$ atoms/cm$^2$ and an energy in the general range of about 10 to 190 keV.

One or more temperature cycles may then follow that can allow for lattice damage repair and/or diffusion of dopant elements. Such a temperature cycle may include a heat treatment (i.e., an anneal) performed in an inert gas environment. As but a few of the possible examples, such an inert gas environment may include a gas and/or mixture of gases selected from the group of nitrogen gas, helium, neon or argon. For manufacturing purposes, nitrogen gas and/or argon may be used, more preferably nitrogen gas.

While a heat treatment step may be performed at atmospheric pressure, such a step may also be performed at a higher or lower pressure.

In particular approaches, a heat treatment temperature may be no less than 700° C., more preferably no less than 750° C. At the same time, a heat treatment temperature may be no greater than 900° C., more preferably no greater than 850° C.

A heat treatment time (i.e., duration) may vary according to temperature, including the rate at which a temperature rises. Thus, a heat treatment time may be in the general range of 5 minutes to 10 hours, more preferably between 5 minutes and 30 minutes.

A heat treatment may be performed in an apparatus that includes a lamp annealing device for conventional heat treatments. Such devices may include, but are not limited to, a thermal diffusion oven, a rapid thermal processor (RTP) and/or a rapid thermal anneal (RTA) machine, or the like.

Heat treatment environments, temperatures, and times may be selected to form a desired impurity profile in the various substrate regions, including LDD regions 007, memory cell source/drain regions 011, and/or peripheral source/drain regions 008. In one particular embodiment, sufficient results may be achieved with a heat treatment in a nitrogen environment at atmospheric pressure, at a temperature of about 800° C., and a duration of approximately 10 minutes.

It is noted that various ion implantation steps following the formation of an etch stop layer 012 may degrade the quality of such an etch stop layer 012. Such a degraded quality can adversely reduce the resistance of an etch stop layer 012 to various etch steps. Consequently, if the quality of an etch stop layer 012 is not improved with respect to etch resistance, various problems may arise. A deteriorated etch stop layer 012 may be more likely to peel and lift from the semiconductor device. Due to reduced etch resistance, an etch stop layer 012 may not protect a semiconductor substrate 001 surface when sidewalls 006 are removed, as will be described below. Further, also due to reduced etch resistance, an etch stop layer 012 may not serve as a contact hole etch stop and a semiconductor substrate 001 can damaged. In addition, if an etch stop layer 012 has reduced resistance, it may be undesirably removed in a contact hole etch, exposing conductive structures, such as gates. Thus, when a conductive material is then formed in the contact hole, a short circuit condition can exist.

According to present invention, however, a heat treatment step, such as that described above, may advantageously restore the quality of an etch stop layer 012. Consequently, following such a heat treatment step, and etch stop layer 012 can have a desired etch resistance, allowing the layer to serve as an etch stop when sidewalls 006 are removed and/or when contact holes are formed.

Figure 1E:
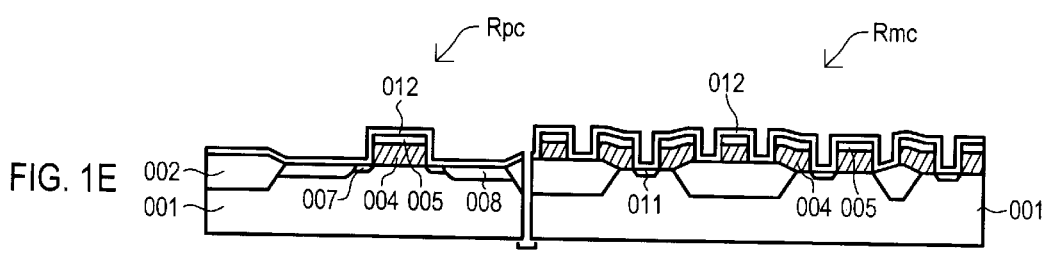

Referring now to FIG. 1E, following a heat treatment step, sidewalls 006 in a peripheral circuit region Rpc can be removed. It is noted that such a step can also remove a sidewall film within inter-gate spaces of a memory cell region Rmc.

In one particular approach, for sidewalls 006 comprising silicon dioxide, such sidewalls 006 may be removed with wet chemical etch using a solution that comprises hydrofluoric acid or a hydrofluoric acid and ammonium fluoride. In another particular approach, for sidewalls 006 comprising polysilicon, such sidewalls 006 may be removed with wet chemical etch using a solution that comprises hydrofluoric acid and nitric acid, or acetic acid and iodine.

Figure 1F:
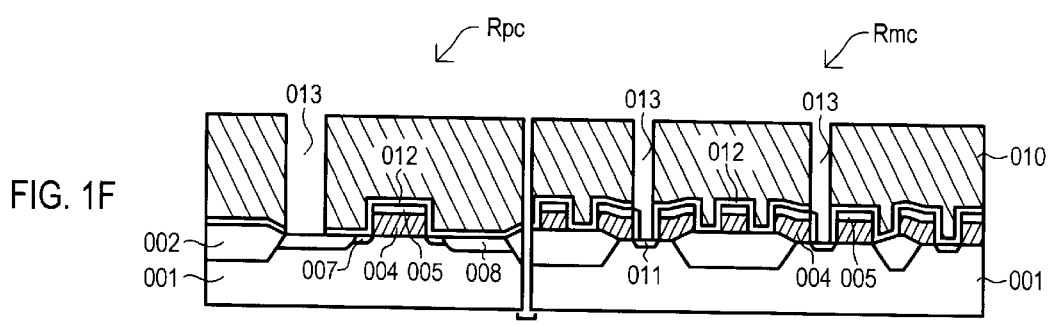
Figure 2A:
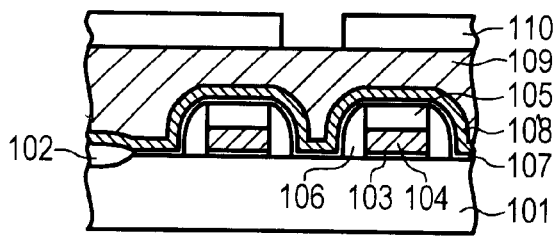
FIGS. 2A to 2C are side cross sectional views of a conventional method of forming self-aligned contacts.
Figure 2B:
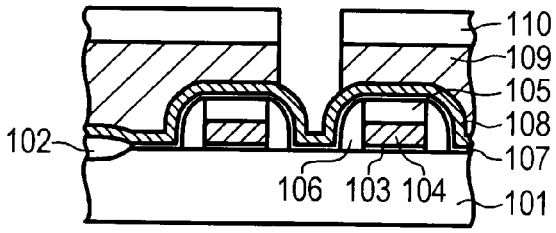
Figure 2C:
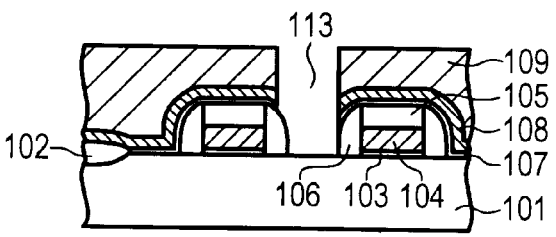
Figure 3A:
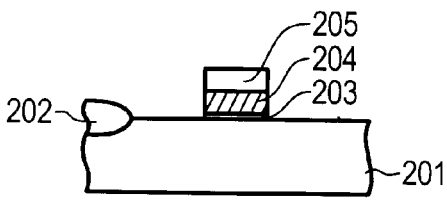
FIGS. 3A to 3D are side cross sectional views of a conventional method of forming a metal-oxide-semiconductor (MOS) field effect transistor with lightly doped diffusion (LDD) regions.
Figure 3B:
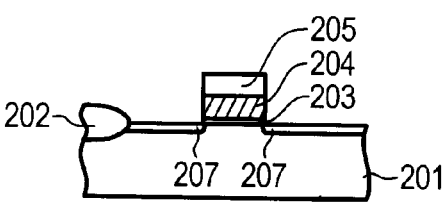
Figure 3C:
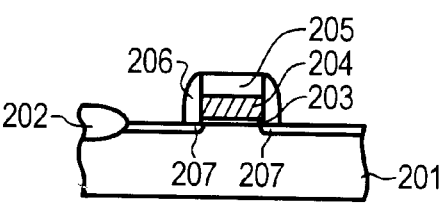
Figure 3D:
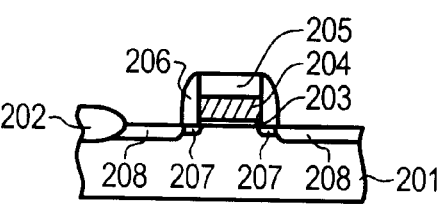
Figure 4A:
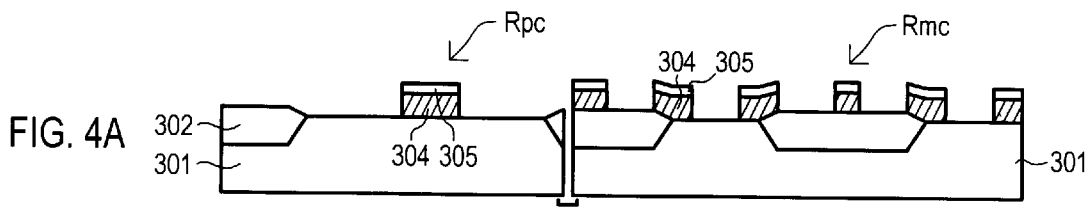
FIGS. 4A to 4D are side cross sectional views of a method of forming a semiconductor device having a high density region and a LDD region.
Figure 4B:
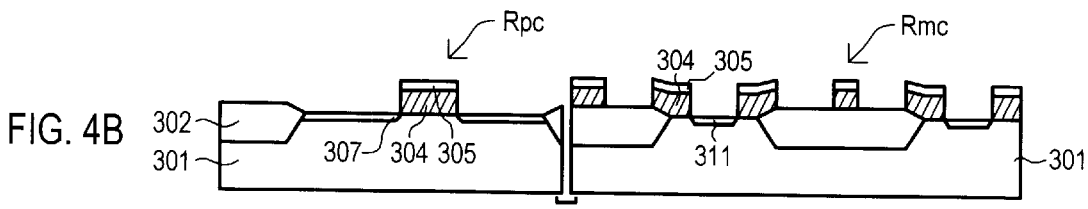
Figure 4C:
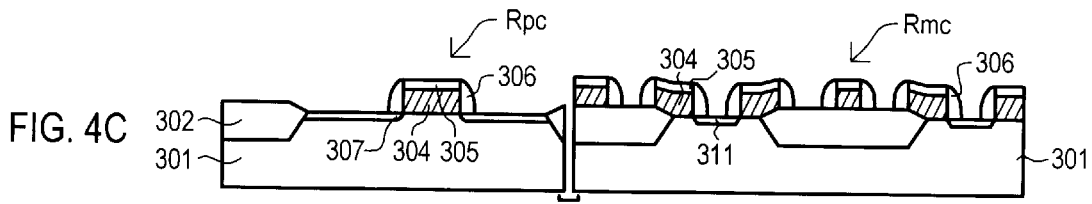
Figure 4D:
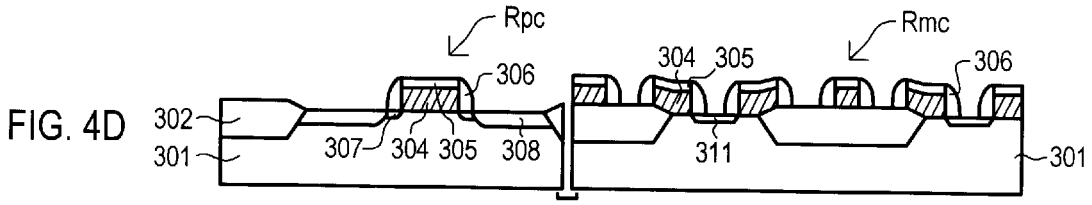
Figure 5A:
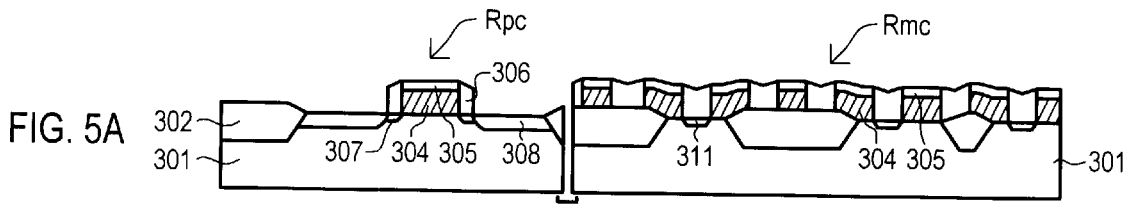
FIGS. 5A to 5D are side cross sectional views of the method of forming a semiconductor device having a high density region and a LDD region shown in FIGS. 4A to 4D.
Figure 5B:
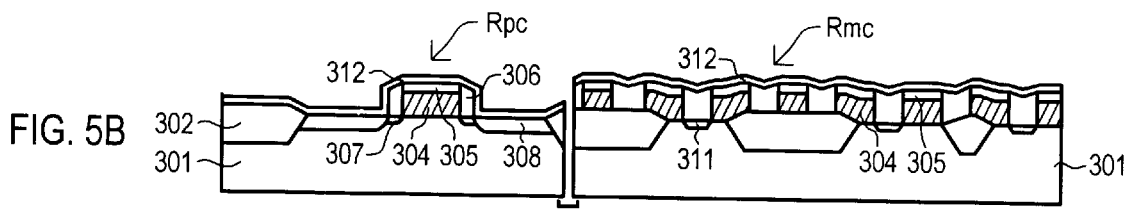
Figure 5C:
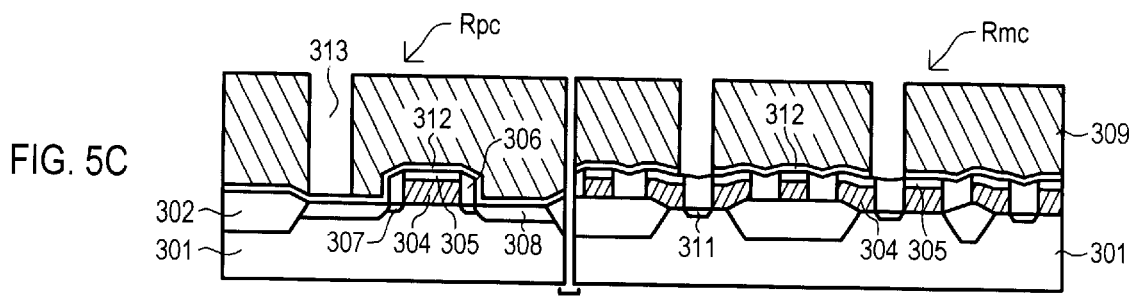
Figure 5D:
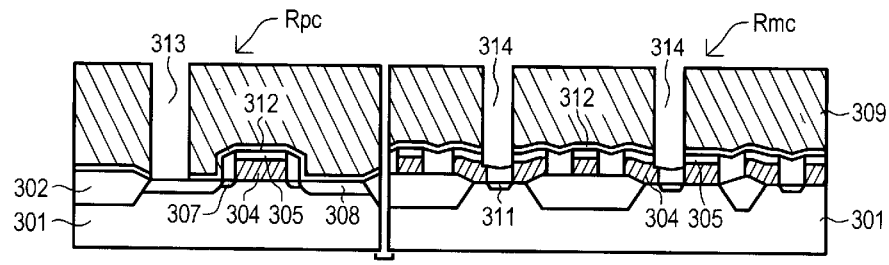
Figure 6A:
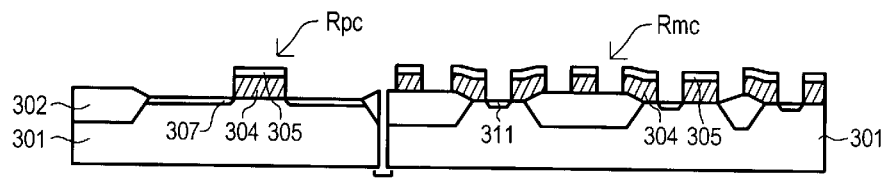
FIGS. 6A to 6C are side cross sectional views of a second conventional method of forming a semiconductor device having a high density region and a LDD region.
Figure 6B:
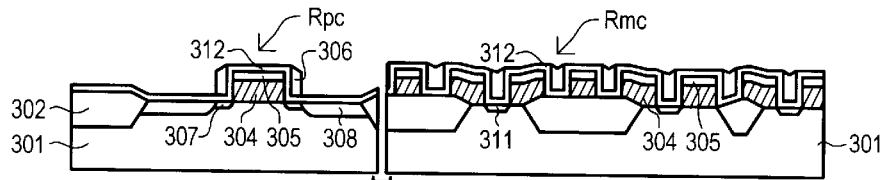
Figure 6C:
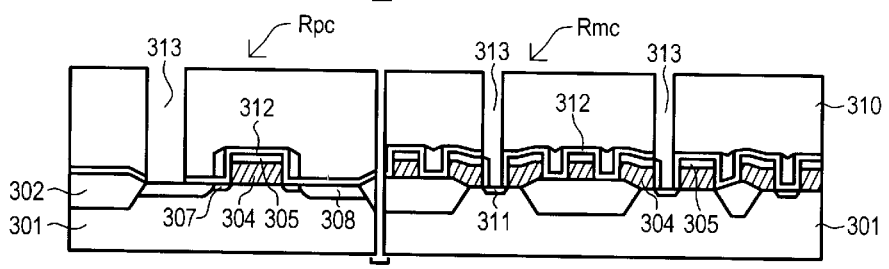
Figure 7A:
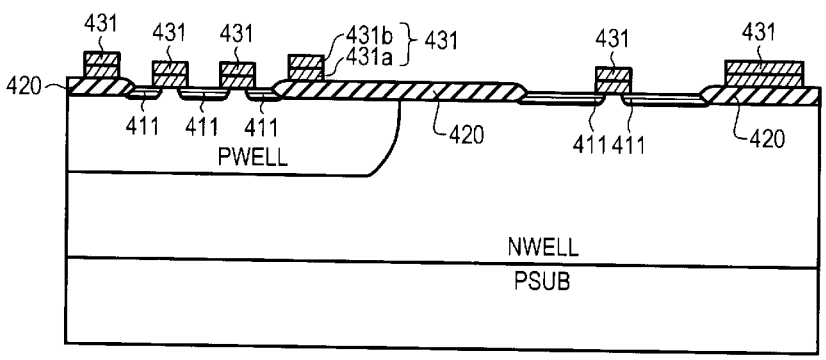
FIGS. 7A to 7C are side cross sectional views of a method of forming a contact over bit line (COB) type DRAM device.
Figure 7B:
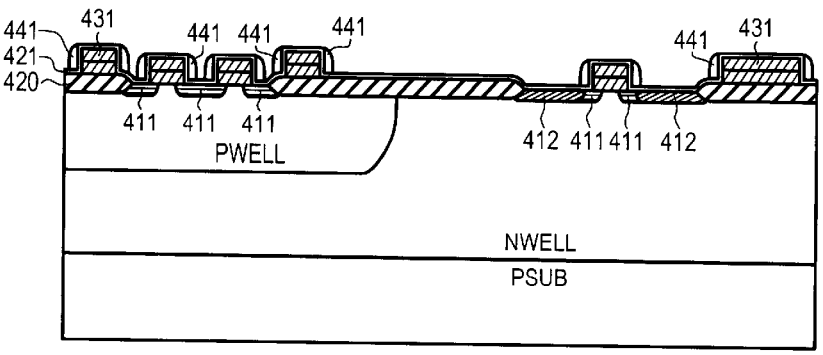
Figure 7C:
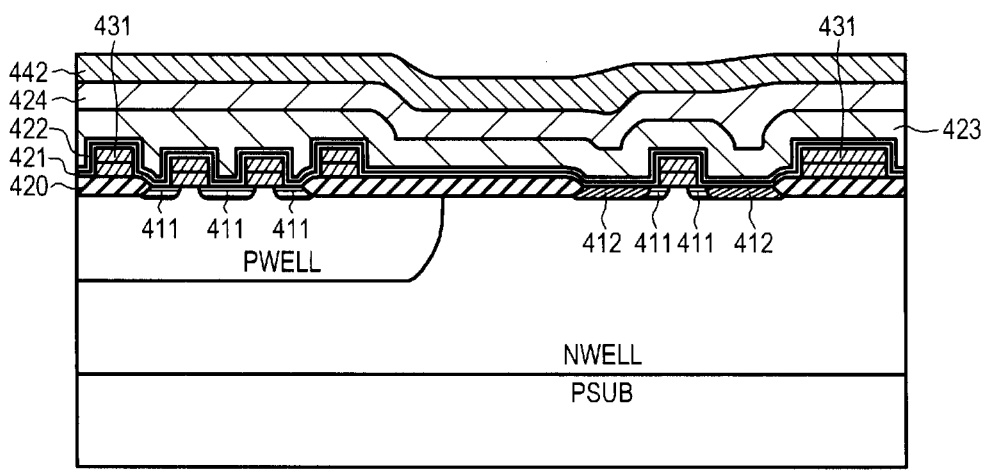
Figure 8D:
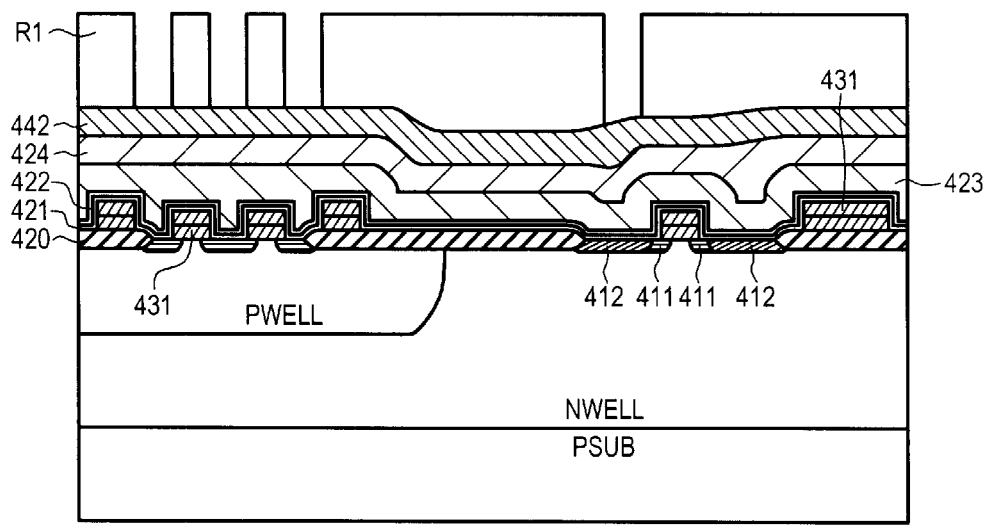
FIGS. 8D and 8E are further side cross sectional views of the method of forming a contact over bit line (COB) type DRAM.
Figure 8E:
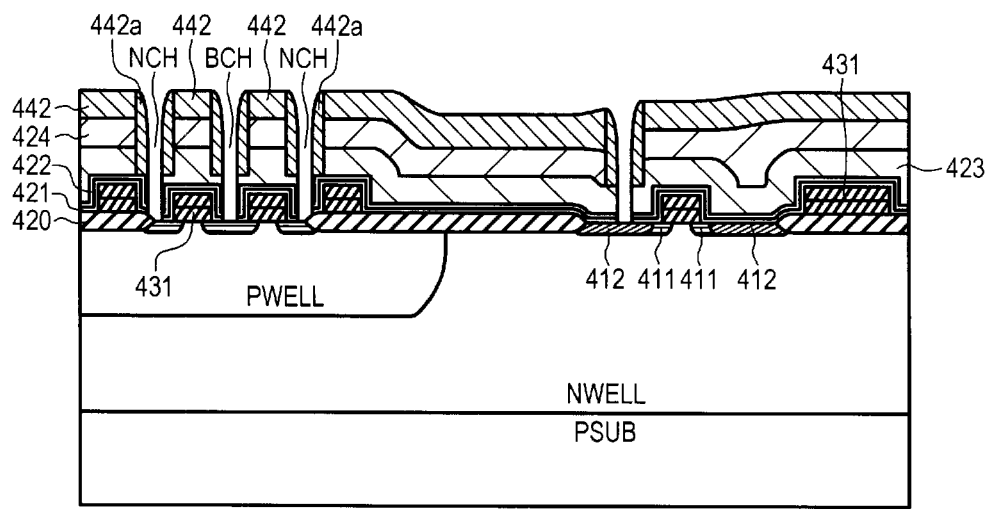

Referring now to FIG. 1F, an interlayer insulating film 010 may be deposited. An interlayer insulating film 010 may comprise silicon dioxide and/or borophosphosilicate glass (BPSG) deposited with CVD techniques. A contact hole etch mask (not shown) may then be formed over an interlayer insulating film 010. In one arrangement, a contact hole etch mask may be formed from a resist and include openings at the desired location of a contact hole.

A contact hole etch may then be performed. Such a contact hole etch may anisotropically etch an interlayer insulating film 010 and be selective with respect to an etch stop layer 012. Thus, following such a step, contact holes may be formed through interlayer insulating film 010 that expose an etch stop layer 012. A contact hole etch may further include anisotropically etching an etch stop layer 012 with an etch that is selective to a semiconductor substrate 001. As shown in FIG. 1F, such a etch step may remove a portion of an etch stop layer 012 formed over a gate layer 004. However, a gate layer may remain protected as a top insulating layer 005 can remain essentially intact. At the same time, such an etch step may form an etch stop layer 012 sidewall that can protect the sides of a gate layer 004. Various contact holes are shown in FIG. 1F as items 013.

As was previously noted, according to one embodiment, an etch stop layer 012 may comprise silicon nitride formed over a silicon dioxide layer. In such an arrangement, when an etch stop layer 012 is anisotropically etched to form a contact hole, such an etch may be selective with respect to silicon dioxide. Thus, such a contact hole etch may remove an etch stop layer 012 from the bottom of a contact hole and expose the silicon dioxide layer. The silicon dioxide layer may then be removed with a different etch to expose a semiconductor substrate 001.

It is noted however, that a top insulating layer 005 can also be formed from silicon dioxide. In such a case, if a silicon dioxide layer is formed below an etch stop layer 012, such a silicon dioxide layer should have a thickness that is less than that of the top insulating layer 005. Such a smaller thickness in the silicon dioxide layer can ensure that a top insulating layer 005 is not removed (exposing a gate layer 004) when the silicon dioxide layer is etched to expose the semiconductor substrate 001.

Following the formation of contact holes 013, such contact holes 013 may then be filled with a conductive material, thereby forming contacts. Such contacts may be to transistors having LDD structures 007 in a peripheral circuit region Rpc, and may be self-aligned contacts in a memory cell region Rmc.

In one particular arrangement, contact holes 013 in a memory cell region Rmc may be filled with tungsten and/or polysilicon. The resulting contact structures can be connected to, and/or from part of, other memory cell array structures, such as bit lines and/or memory cell capacitors. Contact holes 013 within a peripheral circuit region Rpc may be filled with tungsten or the like, and can be connected to higher level wiring layers, as but one example.

The various embodiments have disclosed a method of manufacturing a semiconductor device that can include LDD regions and self-aligned contacts while at the same time providing reduced spacing between adjacent structures (such as inter-gate spacing). In particular, one region of a semiconductor substrate may include transistors with LDD regions, while another region of the semiconductor substrate may include self-aligned contacts for reduced inter-gate spacing.

The present invention, has also disclosed an etch stop layer 012 that may comprise silicon nitride. Such an etch stop layer 012 may allow sidewalls 006 (used to establish LDD regions 007) to be formed from various materials, including insulating materials and/or polysilicon. Such an etch stop layer 012 may protect structures, such as transistor gates while at the same time allowing for the removal of sidewalls 006 that are used to form LDD regions 007.

While the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of manufacturing a semiconductor device, comprising the steps of:
   forming conductive structures having a top insulating layer in a first area and a second area;
   forming a lightly doped diffusion (LDD) region in the first area;
   forming an etch stop layer over the first and second areas;
   forming a sidewall layer over the first and second areas;
   etching the sidewall layer selectively with respect to the etch stop layer to form sidewalls on sides of the conductive structures in the first area;
   forming a source/drain region in the first area;
   heat treating the semiconductor device;
   removing the sidewalls;
   forming an interlayer insulating film over the first and second areas; and
   etching contact holes through the interlayer insulating film and etch stop layer to form self-aligned contacts in the second area with insulating sidewalls formed from the etch stop layer.

2. The method of claim 1, wherein:
   the step of removing the sidewalls includes a wet chemical etch comprising hydrofluoric acid.

3. The method of claim 1, wherein:
   the sidewall layer comprises silicon dioxide.

4. The method of claim 1, wherein:
   the heat treatment is performed in an inert gas environment at a temperature in the general range of 700° C. to 900° C.

5. The method of claim 4, wherein:
   the inert gas environment includes a gas selected from the group consisting of nitrogen, argon, helium and neon.

6. The method of claim 1, wherein:
   the conductive structures in the second area include transistor gates having an inter-gate spacing no greater than two times the thickness of the sidewall layer.

7. The method of claim 1, wherein:
   the conductive structures include transistor gates, and the first area includes peripheral circuit insulated gate field effect transistors (IGFETs) and the second area includes dynamic random access memory (DRAM) cells.

8. The method of claim 1, wherein:
   the etch stop layer comprises silicon nitride.

9. The method of claim 1, further including:
   forming a source/drain region in the second area after forming the conductive structures but before forming the sidewall layer.

10. The method of claim 1, wherein:
    the sidewall layer comprises polysilicon.

11. A method of manufacturing a semiconductor device, comprising the steps of:
    implanting ions into an etch stop layer formed on a semiconductor substrate; and
    heat treating the etch stop layer to increase the etch resistance of the etch stop layer.

12. The method of claim 11, wherein:
    the etch stop layer comprises silicon nitride.

13. The method of claim 12, wherein:
    the etch stop layer has a thickness in the general range of 10 nm to 100 nm.

14. The method of claim 11, wherein:
    heat treating the etch stop layer includes a heat treatment in an inert gas environment.

15. The method of claim 14, wherein:
    the inert gas environment includes a gas selected from the group consisting of nitrogen, argon, helium and neon.

16. A method of manufacturing a semiconductor device, comprising:
    forming an etch stop layer over conductive structures formed on a substrate that includes a lightly doped diffusion (LDD) region;
    implanting ions into the etch stop layer while forming a source/drain region adjacent to the LDD region;
    heat treating the etch stop layer; and
    etching the etch stop layer to form a self-aligned contact that includes a sidewall formed from the etch stop layer.

17. The method of claim 16, wherein:
    the conducting structures include a gate layer comprising polysilicon with a top insulating layer comprising silicon dioxide and the etch stop layer comprises silicon nitride.

18. The method of claim 16, wherein:
    the heat treatment includes a temperature in the general range of 700° C. to 900° C.

19. The method of claim 16, further including:
    forming a sidewall layer over the etch stop layer and etching the sidewall layer to form LDD sidewalls on the conductive structures; and
    implanting ions into the etch stop layer also includes implanting ions into the LDD sidewalls.

20. The method of claim 19, further including:
    removing the LDD sidewalls prior to etching the etch stop layer with an etch that is selective to the etch stop layer; and
    etching through an interlayer insulating film, prior to etching the etch stop layer, with a contact hole etch that is selective to the etch stop layer.

* * * * *